(12) United States Patent
Park et al.

(10) Patent No.: US 7,834,439 B2
(45) Date of Patent: Nov. 16, 2010

(54) SEMICONDUCTOR MODULE AND METHOD OF MANUFACTURING THE SAME

(75) Inventors: Sang-Wook Park, Chungcheongnam-do (KR); Seung-Jae Lee, Chungcheongnam-do (KR); Seung-Yeol Yang, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 232 days.

(21) Appl. No.: 11/942,552

(22) Filed: Nov. 19, 2007

(65) Prior Publication Data

US 2008/0122083 A1    May 29, 2008

(30) Foreign Application Priority Data

Nov. 29, 2006   (KR) .................. 10-2006-0119131

(51) Int. Cl.
    *H01L 23/04*   (2006.01)
(52) U.S. Cl. ................ 257/684; 257/692; 257/E23.004; 257/E23.013
(58) Field of Classification Search .................. 257/692, 257/E23.004, E23.013, 684
    See application file for complete search history.

(56) References Cited

U.S. PATENT DOCUMENTS

| | | | | |
|---|---|---|---|---|
| 5,801,438 A | * | 9/1998 | Shirakawa et al. | ........... 257/685 |
| 5,866,952 A | * | 2/1999 | Wojnarowski et al. | ...... 257/788 |
| 6,528,236 B1 | * | 3/2003 | Fukase et al. | ............ 430/280.1 |
| 7,271,476 B2 | * | 9/2007 | Nishikawa et al. | .......... 257/684 |
| 2004/0056104 A1 | * | 3/2004 | Osawa et al. | ................ 235/492 |
| 2005/0258548 A1 | * | 11/2005 | Ogawa et al. | ................ 257/778 |

FOREIGN PATENT DOCUMENTS

| | | |
|---|---|---|
| JP | 2002-196037 | 7/2002 |
| JP | 2005-197342 | 7/2005 |
| JP | 2005-197354 | 7/2005 |

(Continued)

OTHER PUBLICATIONS

Davidson et al.—Fermi National Accelerator Laboratory, Measurement of the Elastic Modulus of Kapton Perpendicular to the Plane of the Film at Room and Cryogenic Temperatures, Apr. 1992, Fourth Annual IISSC Conference (Mar. 4-6, 1992), FERMILAB-Conf-92/100.*

(Continued)

*Primary Examiner*—Allan R Wilson
(74) *Attorney, Agent, or Firm*—Harness, Dickey & Pierce, P.L.C.

(57) ABSTRACT

A semiconductor module preferably includes a semiconductor package and a printed circuit board (PCB). The semiconductor package can include an outer terminal. The PCB can include a terminal land that is electrically connected to the outer terminal. The PCB preferably has a recess configured to at least partially expose the terminal land and to receive the outer terminal. The recess preferably has a width that is less than a width of the semiconductor package. Damage to edge portions of the semiconductor package whose outer terminal is received into the recess may be prevented, because the edge portions make contact with and are supported by the PCB. One or more support members can also be provided to contact one or more sides of the edge portions of the semiconductor package to further prevent damage due to horizontal impacts.

18 Claims, 9 Drawing Sheets

FOREIGN PATENT DOCUMENTS

KR   2006-0026130   3/2006

OTHER PUBLICATIONS

No author listed, ULTEM® Detailed Properties (Polyetherimide), Copyright 1997-2005 (no months given), Parker-TexLoc, The TexLoc Closet, pp. 1 and 2, http://www.texloc.com/closet/cl_ultem_properties.htm.*

English language abstract of Japanese Publication No. 2005-197342.
English language abstract of Japanese Publication No. 2005-197354.
English language abstract of Korean Publication No. 2006-0026130.

* cited by examiner

SEMICONDUCTOR MODULE AND METHOD OF MANUFACTURING THE SAME

CROSS-REFERENCE TO RELATED APPLICATION

This application claims priority under 35 U.S.C. §119 from Korean Patent Application No. 2006-119131 filed on Nov. 29, 2006, the contents of which are herein incorporated by reference in their entirety.

BACKGROUND OF THE INVENTION

1. Field of the Invention

Various principles of the present invention relate to a semiconductor module and a method of manufacturing the same. More particularly, the concepts of the present invention relate to an improved semiconductor module including a semiconductor package and a printed circuit board, and to a method of manufacturing the improved semiconductor module.

2. Description of the Related Art

Generally, to form a plurality of semiconductor chips, various semiconductor manufacturing processes may be carried out on a semiconductor substrate. Further, to mount the semiconductor chips on a motherboard, a packaging process may be performed on the semiconductor substrate to form a semiconductor package. The semiconductor package may then be mounted on a printed circuit board (PCB) to complete a semiconductor module.

Examples of conventional semiconductor modules are disclosed in Japanese Patent Laid-Open Publication Nos. 2005-197354 and 2005-197342, and Korean Patent Laid-Open Publication No 2006-26130. In these conventional semiconductor modules, solder balls can be used as outer terminals of a semiconductor package and may be mounted on a surface of a PCB. More specifically, the solder balls are conventionally arranged on a central portion of the semiconductor package with gaps between the PCB and edge portions of the semiconductor package where the solder balls are not arranged. Unfortunately, as a result of the gaps, the PCB may not support the edge portions of the semiconductor package and the edge portions of the semiconductor package may be easily damaged due to stresses applied to the edge portions of the semiconductor package.

SUMMARY OF THE INVENTION

According to exemplary embodiments incorporating principles of the present invention, a semiconductor module that is capable of preventing edge portions of a semiconductor package from being damaged is provided. The principles of the present invention also provide a method of manufacturing an improved semiconductor module.

More particularly, a semiconductor module constructed in accordance with various principles of the present invention may include a semiconductor package and a printed circuit board (PCB). The semiconductor package can include an outer terminal. The PCB can include a terminal land electrically connected to the outer terminal. And the PCB preferably has a recess that receives the outer terminal and partially exposes the terminal land. The recess preferably has a width less than that of the semiconductor package.

According to one exemplary embodiment, the PCB may include a substrate body and an insulation layer pattern formed on the substrate body. The insulation layer pattern may have the recess formed therein. The recess may include a first opening that exposes the terminal land and a second opening in communication with the first opening. The second opening may have a width greater than that of the first opening. An inner face of the first opening preferably makes close contact with the outer terminal. And the insulation layer pattern may make contact with the semiconductor package.

According to another embodiment incorporating principles of the present invention, the PCB may include a substrate body, an insulation layer pattern formed on the substrate body, and a spacer formed on the insulation layer pattern. The insulation layer pattern may have a first opening for partially exposing the terminal land. The spacer may further include a second opening having a width greater than that of the first opening. The first and second openings may form a recess. And the spacer may make contact with the semiconductor package.

According to additional aspects of the present invention, the semiconductor module may further include a supporting member formed on the PCB (such as on the substrate body or the insulation layer pattern) to surround side faces of the semiconductor package. The supporting member may make contact with the side faces of the semiconductor package to reduce the likelihood of damage due to horizontal impacts.

According to a further aspect of the present invention, an attaching member may be interposed between the outer terminal and the terminal land.

A semiconductor module constructed in accordance with another embodiment of the present invention can include a PCB, a first semiconductor package, and a second semiconductor package. The PCB preferably includes a first face and a second face located opposite to the first face. The first face preferably has a first terminal land, and the second face preferably has a second terminal land. The first semiconductor package can include a first outer terminal electrically connected to the first terminal land. The second semiconductor package can include a second outer terminal electrically connected to the second terminal land. The PCB preferably has a first recess formed in the first face to partially expose the first terminal land and a second recess formed in the second face to partially expose the second terminal land. The first recess preferably has a width less than that of the first semiconductor package and receives the first outer terminal. The second recess preferably has a width less than that of the second semiconductor package and receives the second outer terminal.

A method of manufacturing a semiconductor module is also provided in accordance with still further principles of the present invention. According to this method, a semiconductor package is prepared having an outer terminal. A recess for receiving the outer terminal is formed in a PCB having a terminal land to expose the terminal land through the recess. The recess preferably has a width less than that of the semiconductor package. The outer terminal can then be mounted on the terminal land.

According to one exemplary embodiment, forming the recess may include forming an insulation layer on the PCB and patterning the insulation pattern to form the recess in the insulation layer pattern. Forming the insulation layer pattern may further include forming a first opening through the insulation layer to expose the terminal land, and forming a second opening through the insulation layer in communication with the first opening. The second opening may have a width greater than that of the first opening.

According to another exemplary embodiment, forming the recess may include forming an insulation layer on the PCB, patterning the insulation pattern to form an insulation layer pattern having a first opening that exposes the terminal land, and forming a spacer on the insulation layer pattern. The spacer may have a second opening that is in communication with the first opening and has a width greater than that of the first opening.

According to still another embodiment, mounting the outer terminal on the terminal land may include forming a conductive flux on the outer terminal, forming a solder paste on the terminal land, and attaching the conductive flux to the solder paste.

According to various principles of the present invention, an outer terminal may be received in a recess formed in the PCB such that edge portions of the semiconductor package (where the outer terminal is not arranged) may make contact with the PCB. In this manner, the PCB may firmly support, and thereby prevent damage to, the edge portions of the semiconductor package.

BRIEF DESCRIPTION OF THE DRAWINGS

The above and other features and advantages of the invention will become more readily apparent through the following detailed description, which proceeds with reference to the accompanying drawings, wherein.

DETAILED DESCRIPTION

The principles of the present invention will now be described more fully with reference to the accompanying drawings, in which various preferred embodiments are shown. It should be noted, however, that the principles of the present invention may be incorporated and embodied in many different forms and the invention should therefore not be construed as being limited to the specific embodiments set forth herein. Rather, these embodiments are provided to satisfy the enablement and best mode requirements and to fully convey the scope of the invention to those skilled in the art. In the drawings, the size and relative sizes of layers and regions may be exaggerated for clarity and like numbers refer to like elements throughout.

It should further be understood that when an element or layer is referred to as being "on", "connected to", or "coupled to" another element or layer, that layer may be directly on, connected to, or coupled to the other element or layer, or intervening elements or layers may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It should also be understood that, although the terms "first", "second", etc. may be used herein to describe various elements, components, regions, layers and/or sections; these elements, components, regions, layers and/or sections should not be limited by the use of these terms. Rather, these terms are only used to distinguish one element, component, region, layer or section from another region, layer or section. Thus, a "first" element, component, region, layer or section discussed below could be termed a "second" element, component, region, layer or section without departing from the teachings of the present invention.

In addition, spatially relative terms, such as "beneath", "below", "lower", "above", "upper", and the like, may be used herein for ease of description to describe one element or feature's relationship to another element(s) or feature(s) as illustrated in the figures. It will be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or any other orientation) and the spatially relative descriptors used herein should be interpreted accordingly.

The terminology used herein is for the purpose of describing particular embodiments only and is not intended to be limiting of the invention. As used herein, the singular forms "a", an and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1:
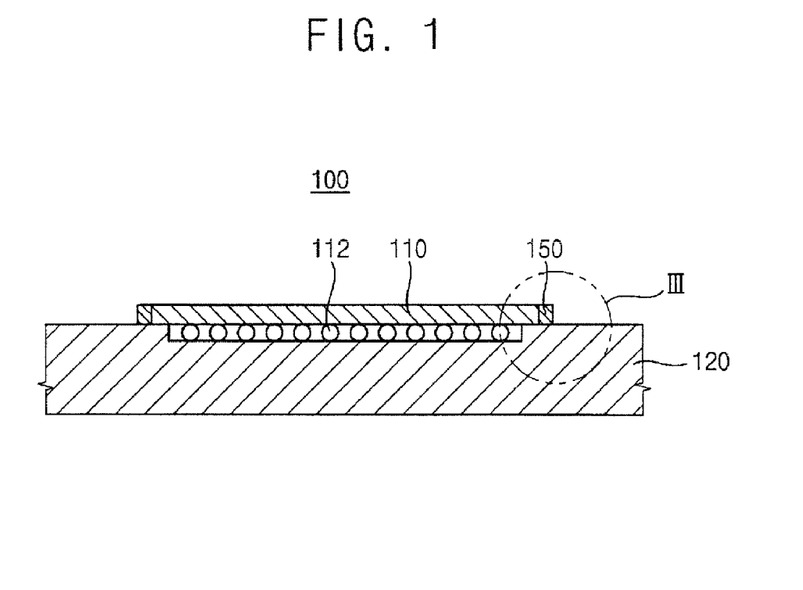
FIG. 1 is a cross-sectional side view illustrating a semiconductor module constructed in accordance with one exemplary embodiment incorporating principles of the present invention.
Figure 2:
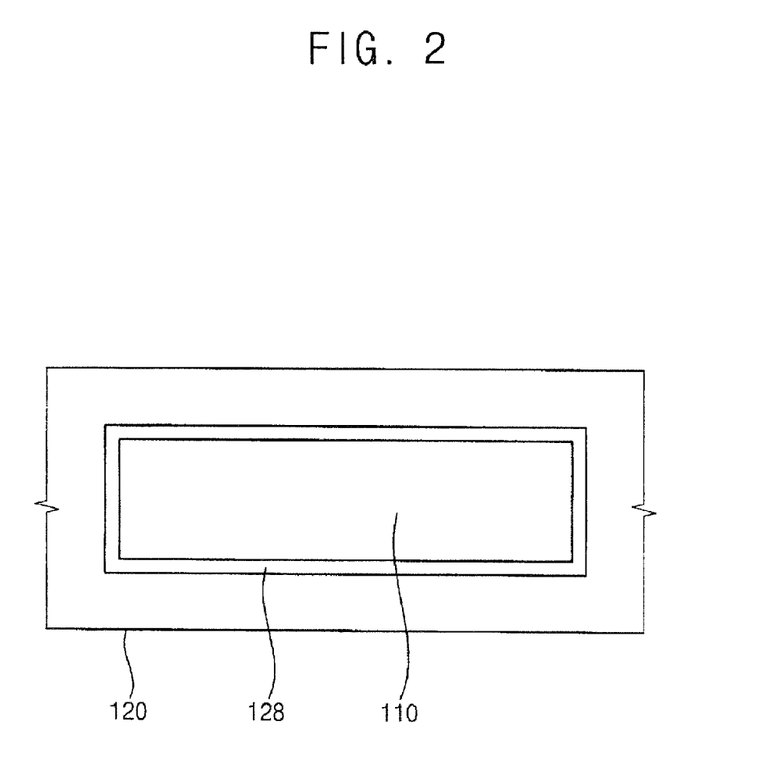
FIG. 2 is a plan view of the semiconductor module of FIG. 1.

FIG. 1 is a cross-sectional side view of a semiconductor module 100 constructed in accordance with one embodiment incorporating principles of the present invention. FIG. 2 is a plan view of the semiconductor module 100 shown in FIG. 1.

Figure 3:
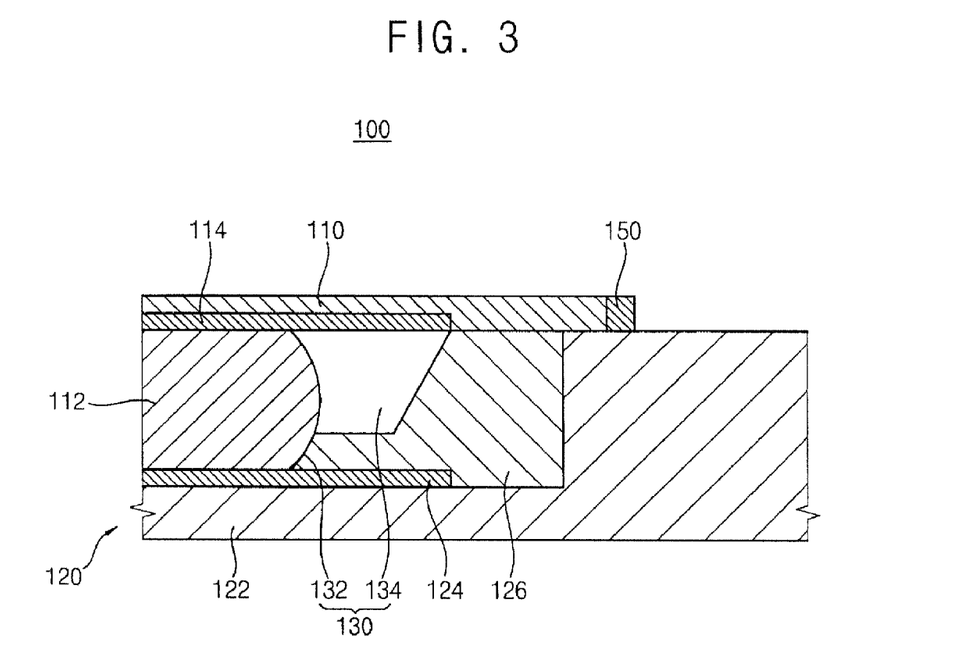
FIG. 3 is an enlarged detail view of a portion "III" of the semiconductor module of FIG. 1.

And FIG. 3 is an enlarged cross-sectional detail view of a portion "III" of the semiconductor module 100 shown in FIG. 1.

Referring to FIGS. 1 through 3, a semiconductor module 100 constructed according to this exemplary embodiment preferably includes a semiconductor package 110 and a printed circuit board (PCB) 120. The semiconductor package 110 can include outer terminals 112. In this embodiment, terminal lands 114 may be formed on a central area of a bottom portion of the semiconductor package 110, which faces the PCB 120, and the outer terminals 112 may be respectively mounted on the terminal lands 114. The outer terminals 112 may further include a solder ball. The PCB 120 is preferably positioned under the semiconductor package 110. The PCB 120 can include a substrate body 122, terminal lands 124 formed at a surface of the substrate body 122, and an insulation layer pattern 126 formed on the substrate body 122.

In this embodiment, the substrate body 122 and the insulation layer pattern 126 may include substantially the same material. For example, the substrate body 122 and the insulation layer pattern 126 may each include a photosensitive resin. Alternatively, the substrate body 122 and the insulation layer pattern 126 may each include materials different from one another. For example, the substrate body 122 may include a photosensitive resin, and the insulation layer pattern 126 may include a material having an elasticity greater than that of the substrate body 122. The materials used for the insulation layer pattern 126 may, for example, include a rubber, an epoxy-based resin, a polyimide-based resin, a fluorine-based resin, or other such materials.

The insulation layer pattern 126 preferably has a recess 130 for exposing the terminal land 124. In this example, the recess 130 has a first opening 132, for exposing the terminal land 124, and a second opening 134 in communication with the first opening 132. The second opening 134 preferably has a width greater than that of the first opening 132 to provide the recess 130 with a stepped structure to receive the outer terminals 112. The first opening 132 and the second opening 134 define the recess 130. The first opening 132 preferably has inner faces that make close contact with the outer terminals 112. More specifically, outermost terminals of the outer terminals 112 preferably closely contact the inner faces of the first opening 132.

The width of the second opening 134 is preferably narrower than the width of the semiconductor package 110. Thus, edge portions of the semiconductor package 110, where the outer terminals 112 are not arranged, preferably make contact with a surface of the insulation layer pattern 126 and are thereby prevented from entering into the second opening 132. Since the insulation layer pattern 126 firmly supports the edge portions of the semiconductor package 110, damage to the edge portions of the semiconductor package 110 can be prevented.

A supporting member 150 may further be formed on the insulation layer pattern 126 or substrate 122 to support one or more side faces of the semiconductor package 110. In the example shown in FIG. 3, the supporting member 150 is arranged on the substrate 122 and makes contact with a side face of the semiconductor package 110. When the semiconductor package 110 has a rectangular plan shape, the supporting member 150 may have a rectangular frame shape arranged to make contact with each of the four side faces of the semiconductor package 110. The supporting member 150 can prevent damage to the semiconductor package that might otherwise result from horizontal impacts.

Figure 4:
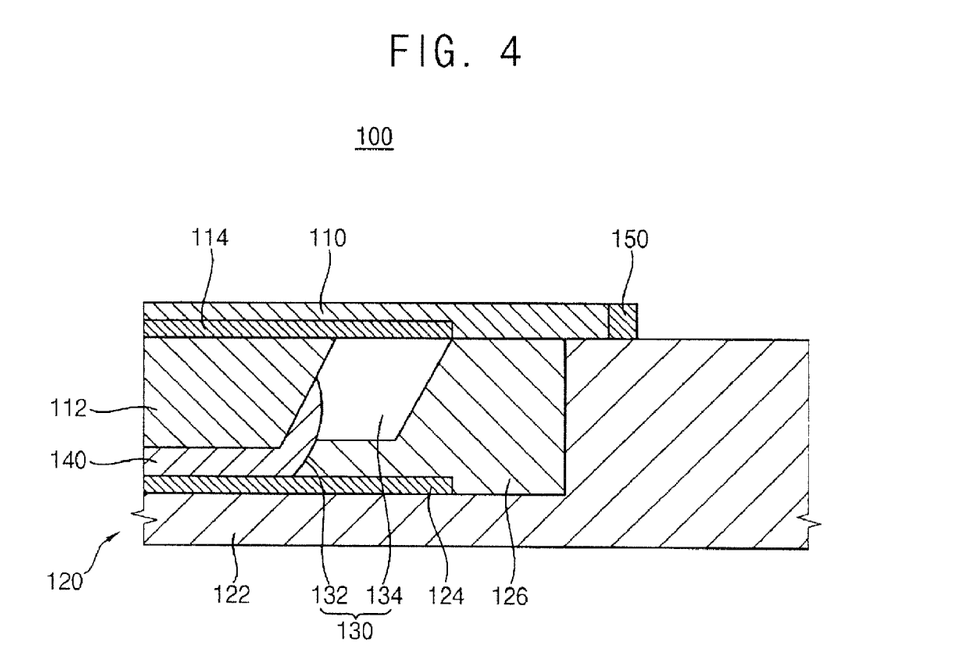
FIG. 4 is an enlarged detail view similar to that of FIG. 3, but illustrating a semiconductor module constructed according to alternative aspects of the present invention, wherein an attaching member includes a material different from that of an outer terminal.

The outer terminals 112 preferably enter into the recess 130 and are attached to the terminal lands 124 of the PCB 120. In this embodiment, the outer terminals 112 may be attached to the terminal lands 124 using an attaching member (not shown). The attaching member may include a solder ball substantially the same as that of the outer terminal 112 as shown in FIG. 3, in which case the attaching member may be integrally formed with the outer terminal 112, rather than being formed as a separate layer. In contrast to the embodiment shown in FIG. 3, FIG. 4 is a somewhat schematic enlarged cross-sectional detail view illustrating a portion "III" of the semiconductor module 100 where the attaching member 140 has a material different from that of an outer terminal 112. Referring to FIG. 4, when an attaching member 140 includes a material such as gold, aluminum, or copper, for example, which is different from a material included in the outer terminal 112, the attaching member 140 may be formed as a separate layer on the outer terminal 112.

Figure 5:
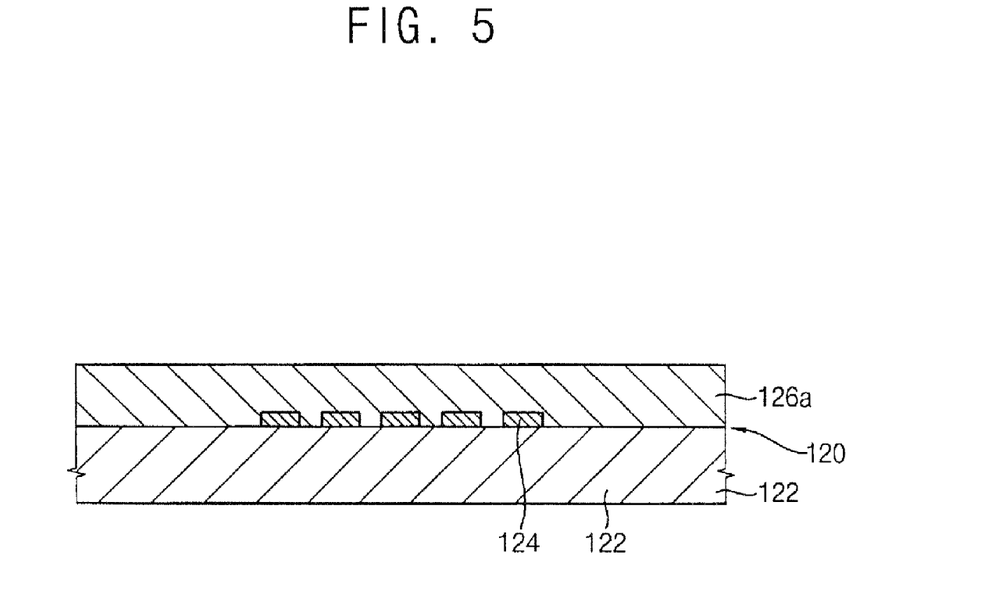
FIGS. 5 through 9 are cross-sectional side views of a semiconductor module illustrating a method of manufacturing the semiconductor module shown in FIG. 1.

FIGS. 5 through 9 are cross-sectional side views illustrating a method of manufacturing the semiconductor module 100 shown in FIG. 1. Referring first to FIG. 5, an insulation layer 126a is preferably formed on the substrate body 122 having the terminal lands 124. In this example, both the substrate body 122 and the insulation layer 126a may include a photosensitive resin. As previously discussed, however, the substrate body 122 may include a photosensitive resin, and the insulation layer 126a may include a material having an elasticity greater than that of the insulation layer 122 such as a rubber, an epoxy-based resin, a polyimide-based resin, a fluorine-based resin, or other such material.

Figure 6:
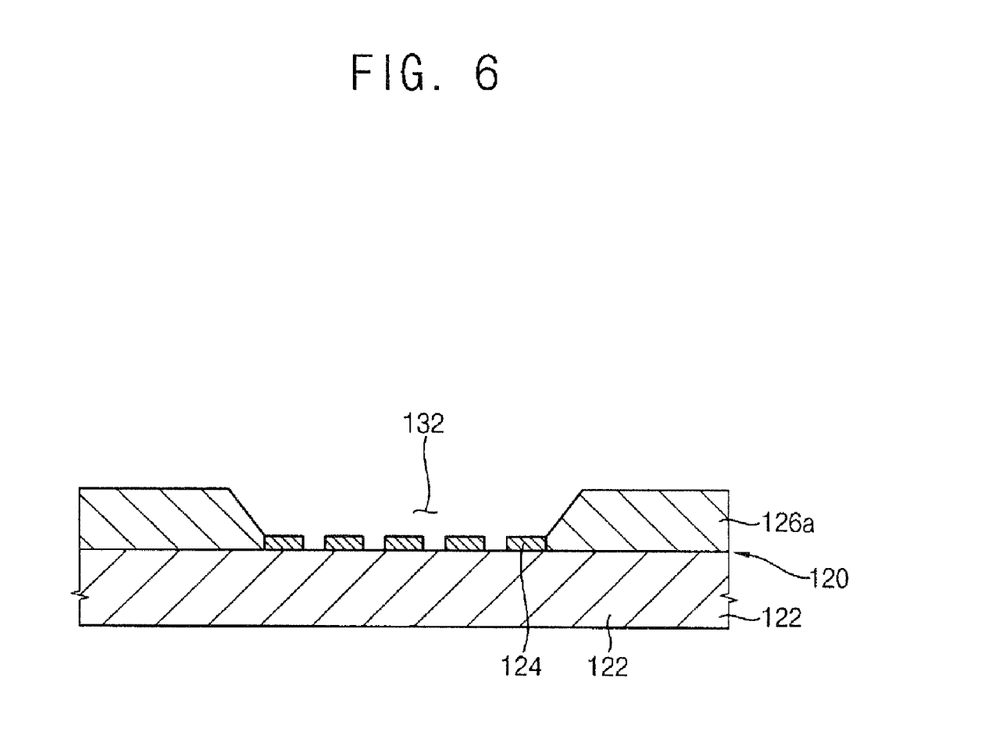
Figure 7:
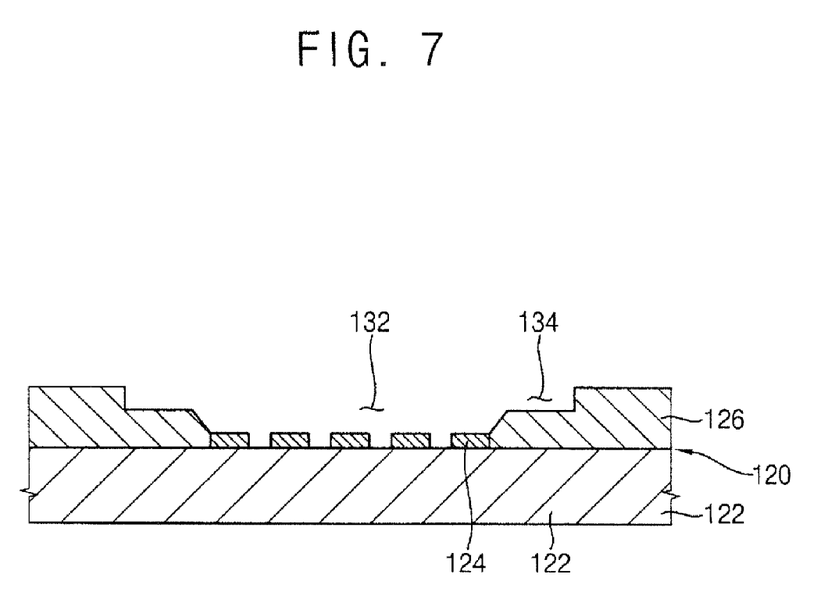

Referring now to FIG. 6, the insulation layer 126a is primarily etched to form the first opening 132 through the insulation layer 126a, thereby exposing the terminal lands 124 through the first opening 132. As shown in FIG. 7, the insulation layer 126a is then secondarily etched to form the second opening 134 in communication with the first opening 132. In this example, the first opening 132 and the second opening 134 are arranged together to form a recess 130 having a stepped structure in the insulation layer pattern 126. That is, the first opening 132 and the second opening 134 provide the recess 130. After etching, the PCB 120 including the substrate body 122 and the insulation layer pattern 126 is completed. In this embodiment, the second opening 134 preferably has a width greater than a width of the first opening 132 but narrower than a width of the semiconductor package 110.

Figure 8:
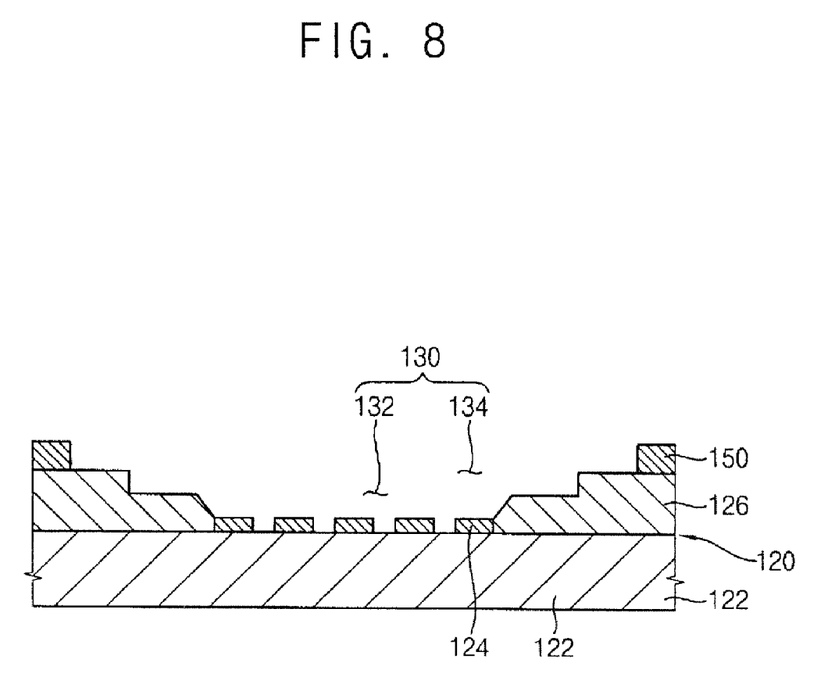

Referring now to FIG. 8, a supporting member 150 can be formed on the insulation layer pattern 126. In this example, the supporting member 150 can be formed, for instance, by forming an insulation layer (not shown) on the insulation layer pattern 126, and by patterning the insulation layer to form the supporting member 150.

Figure 9:
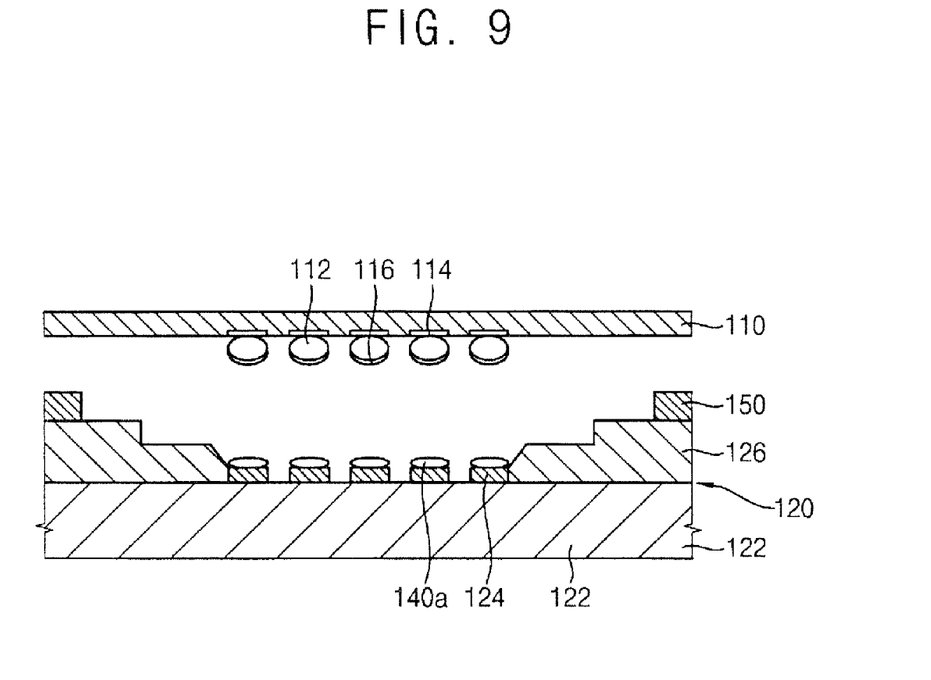

Referring next to FIG. 9, the semiconductor package 110, on which the outer terminals 112 are mounted, is preferably arranged over the PCB 120. A solder paste 140a including a solder is preferably coated onto the terminal lands 124 of the PCB 120. A conductive flux 116 is preferably coated on the outer terminals 112. The outer terminals 112 are then received in the recess 130 to contact the solder paste 140a with the conductive flux 116. A reflow process using an infrared ray is then preferably carried out on the solder paste 140a and the conductive flux 116 to attach the outer terminals 112 to the terminal lands 124 of the PCB 120 and thereby complete the fabrication of the semiconductor module 100. In this embodiment, a lower face of the semiconductor package 110 makes contact with the insulation layer pattern 126, and side faces of the semiconductor package 110 make close contact with the supporting member 150.

Where the solder paste 140a and the outer terminal 112 include substantially the same material (such as solder), the solder paste 140a may be integrally formed with the outer terminal 112. In contrast, when the solder paste 140a includes a material such as gold, copper, aluminum, or other material that is different from a material included in the outer terminal 112, a separate attaching member 140 may be formed between the outer terminal 112 and the terminal land 124.

According to principles of the present invention as reflected this embodiment, an outer terminal of a semiconductor package may be received in a recess formed in a PCB. Edge portions of the semiconductor package may make contact with the PCB and with a supporting member. In this manner, the PCB may firmly support the edge portions of the semiconductor package to prevent them from being damaged.

Figure 10:
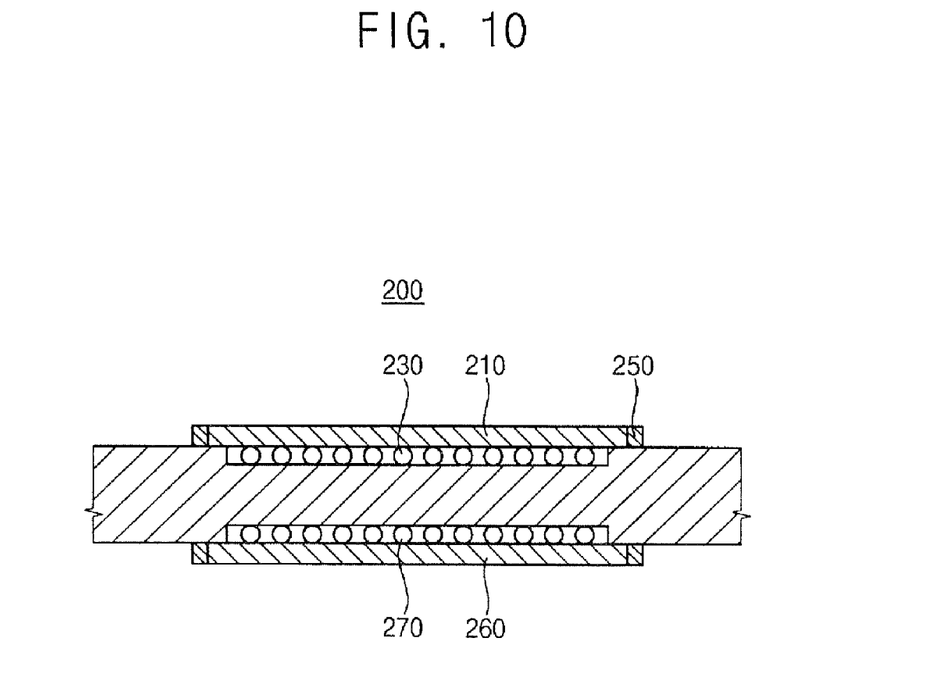
FIG. 10 is a cross-sectional side view illustrating a semiconductor module constructed in accordance with another embodiment incorporating principles of the present invention.

FIG. 10 is a cross-sectional side view illustrating a semiconductor module 200 constructed in accordance with another embodiment incorporating principles of the present invention. Referring to FIG. 10, the semiconductor module 200 constructed according to this embodiment preferably includes a PCB 220, a first semiconductor package 210, and a second semiconductor package 260. The PCB 220 has a first face and a second face arranged opposite to the first face. A first recess 230 is preferably formed in the first face. A second recess 270 can be formed in the second face. The first semiconductor package 210 is received in the first recess 230, while the second semiconductor package 260 is received in the second recess 270.

The first semiconductor package 210 and the second semiconductor package 260 each preferably include elements substantially the same as those of the semiconductor package 110 described previously. In addition, the first recess 230 and the second recess 270 are substantially the same as the recess 130 described previously. Further descriptions of the first and second semiconductor packages 210, 260 and the first and second recesses 230, 270 are therefore omitted herein for brevity.

According to this embodiment, the semiconductor module 200 is constructed having two semiconductor packages, where the first and the second semiconductor packages 210, 260 are mounted on the first and the second faces of the PCB 220, respectively. The method of manufacturing the semiconductor module 200 proceeds by applying the method described previously to each of the faces of the PCB 220. Any further description with respect to the method of manufacturing the semiconductor module 200 is therefore also omitted herein for brevity.

Figure 11:
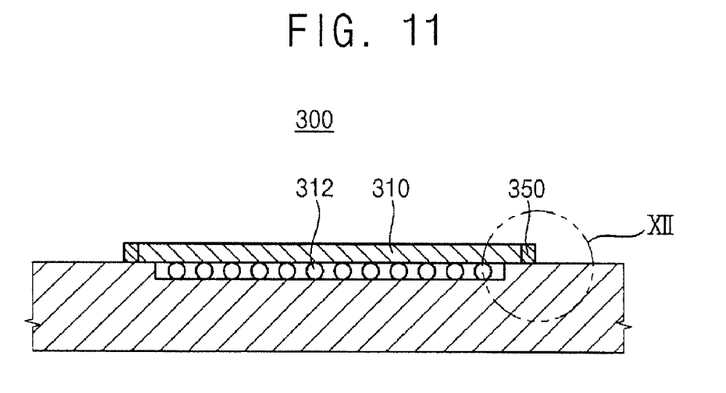
FIG. 11 is a cross-sectional side view illustrating a semiconductor module constructed in accordance with yet another embodiment incorporating principles of the present invention.
Figure 12:
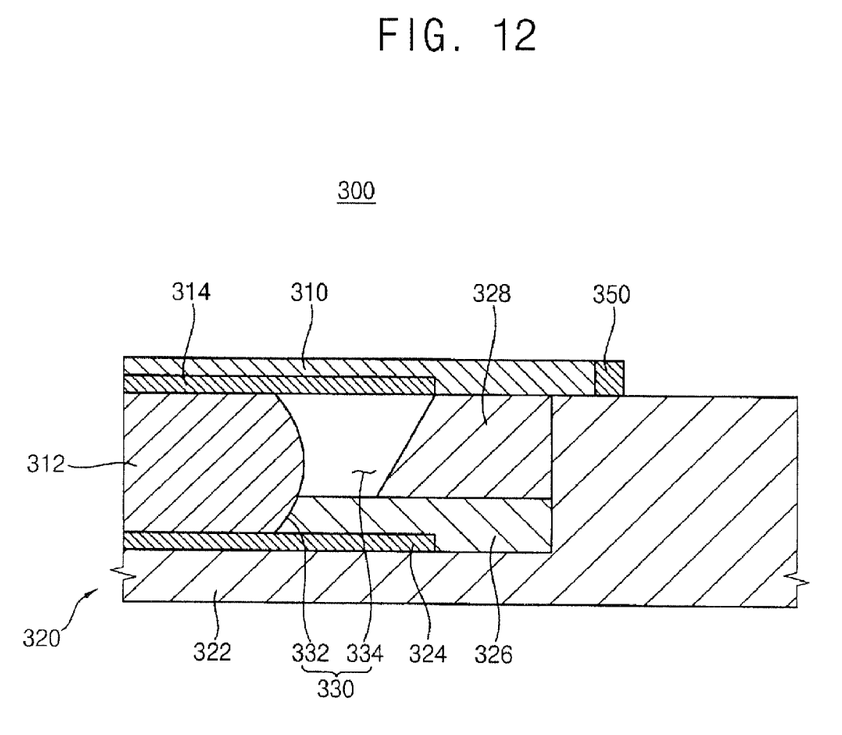
FIG. 12 is an enlarged detail view of a section "XII" of the semiconductor module shown in FIG. 11.

FIG. 11 is a cross-sectional side view illustrating a semiconductor module 300 constructed in accordance with yet another embodiment incorporating principles of the present invention. FIG. 12 is an enlarged detail view of a portion "XII" of the semiconductor module 300 illustrated in FIG. 11.

Referring to FIGS. 11 and 12, a semiconductor module 300 constructed according to this embodiment preferably includes a semiconductor package 310 and a PCB 320. In this example, the semiconductor package 310 can include elements substantially the same as those of the previous embodiments and any further description thereof will therefore be omitted. The PCB 320 is preferably arranged under the semiconductor package 310. The PCB 320 can include a substrate body 322, terminal lands 324 formed on a surface of the substrate body 322, an insulation layer pattern 326 formed on the substrate body 322, a spacer 328 formed on the insulation layer pattern 326, and a supporting member 350 formed on the spacer 328.

The insulation layer pattern 326 preferably has a first opening 332 that exposes the terminal lands 324. The spacer 328 preferably has a second opening 334 that is arranged in communication with the first opening 332. The second opening 334 preferably has a width greater than a width of the first opening 332, but less than a width of the semiconductor package 310. The first opening 332 and the second opening 334 are arranged together to form a recess 330 having a stepped wall structure. The stepped wall structure can, for instance, be a two-stepped structure.

Edge portions of the semiconductor package 310, which are received in the recess 330, preferably make close contact with the spacer 328. The spacer 328 can thereby firmly support the edge portions of the semiconductor package 310 to prevent damage to the edge portions. Additionally, the supporting member 350 may be formed on the spacer 328 to support side faces of the semiconductor package 310. In this embodiment, the supporting member 350 preferably contacts the side faces of the semiconductor package 310 to further prevent damage to the semiconductor package 310.

Figure 13:
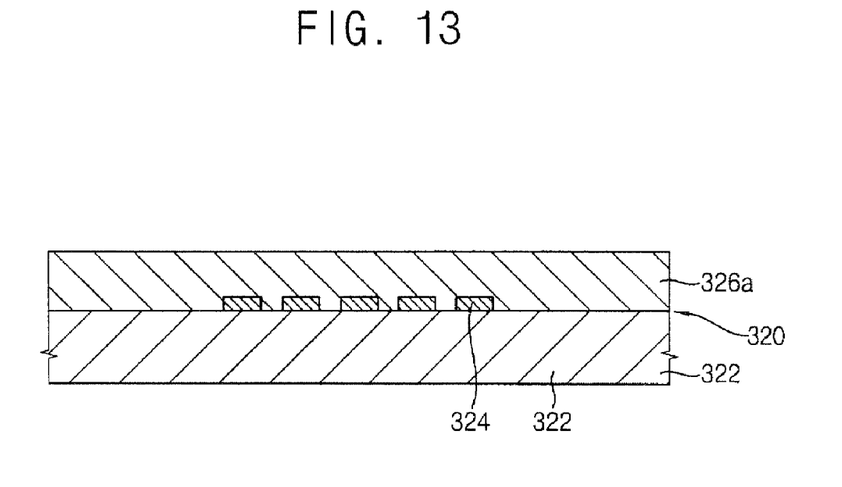
FIGS. 13 through 17 are cross-sectional side views illustrating a method of manufacturing the semiconductor module shown in FIG. 11.
Figure 14:
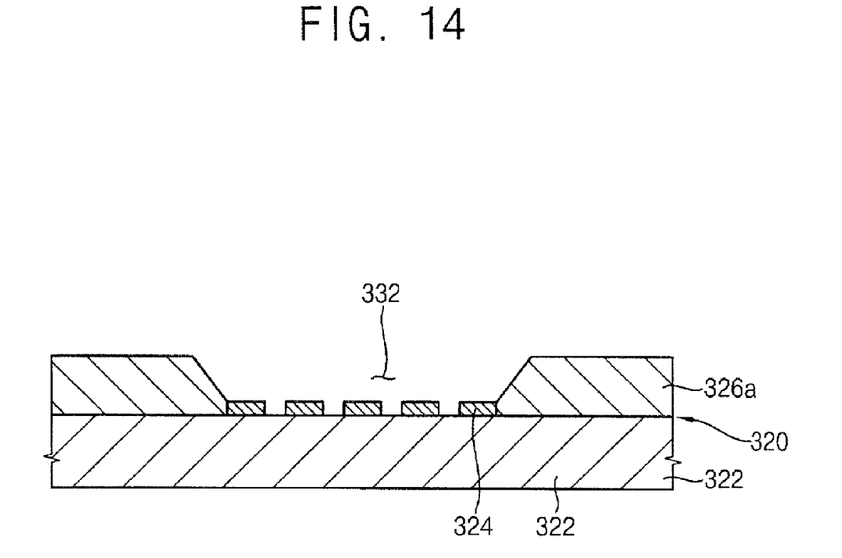

FIGS. 13 through 17 are cross-sectional side views of the semiconductor module 300 illustrating a method of manufacturing the semiconductor module 300 shown in FIG. 11. Referring to FIG. 13, an insulation layer 326a is preferably formed on a substrate body 322 having terminal lands 324. As shown in FIG. 14, the insulation layer 326a is then primarily etched to form an insulation layer pattern 326 having a first opening 332 that exposes the terminal lands 324.

Figure 15:
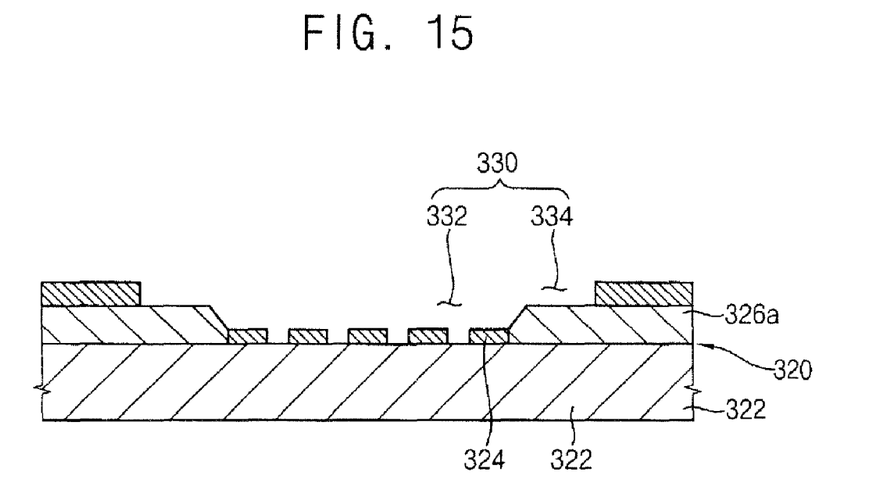

Referring now to FIG. 15, a spacer 328 is preferably formed on the insulation layer pattern 326 having a second opening 324. The first opening 332 and the second opening 334 are preferably arranged together to form a recess 330 having a stepped structure. As a result, the PCB 320, which includes the substrate body 322, the insulation layer pattern 326, and the spacer 328, is completed. In this embodiment, the second opening 334 may have a width greater than that of the first opening 332. In contrast, the width of the second opening 334 may be less than that of the semiconductor package 310.

Figure 16:
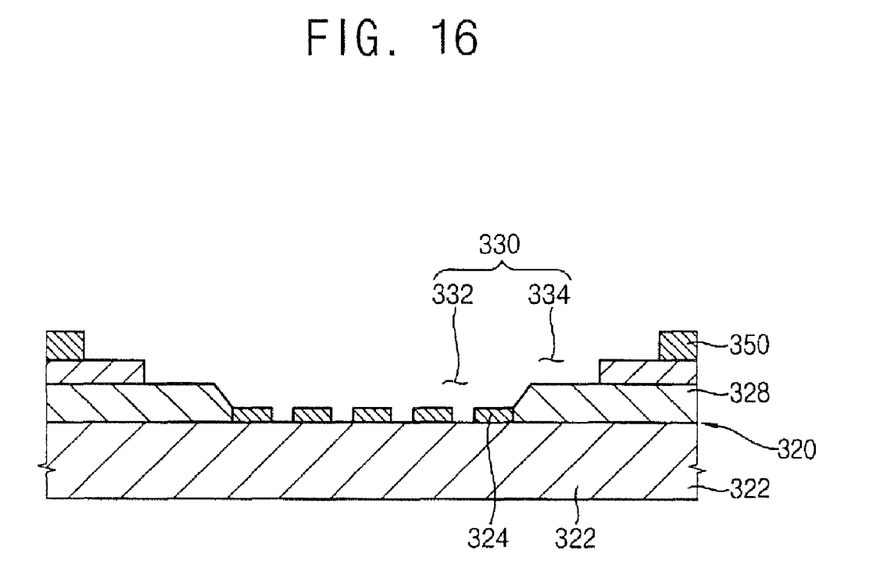
Figure 17:
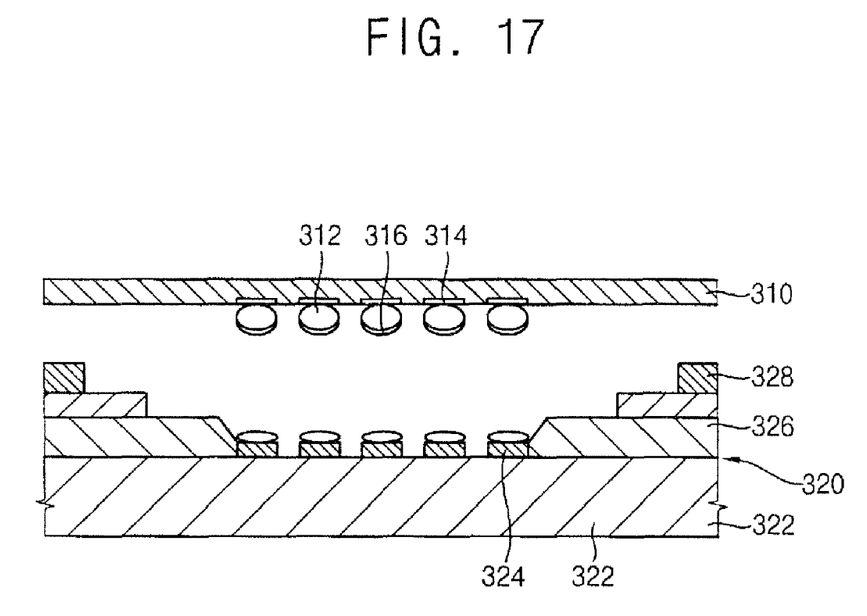

Referring to FIG. 16, a supporting member 350 is next formed on the spacer 328. The supporting member 350 can be formed by forming an insulation layer (not shown) on the spacer 328, and by patterning the insulation layer. As shown in FIG. 17, the semiconductor package 310 on which the outer terminals 312 are mounted can be arranged over the PCB 320. A solder paste 340a, including a solder, is preferably coated on the terminal land 324 of the PCB 320. A conductive flux 316 is preferably coated on the outer terminal 312.

The outer terminals 312 are then received in the recess 330 such that the solder paste 340a contacts the conductive flux 316. A reflow process is then performed on the solder paste 340a and the conductive flux 316 using an infrared ray to attach the outer terminals 312 to the terminal lands 324 of the PCB 320. In this manner, the construction of the semiconductor module 300 is completed. In this embodiment, a lower face of the semiconductor package 310 preferably makes contact with the spacer 328, and the side faces of the semiconductor package 310 make close contact with the supporting member 350.

When the solder paste 340a and the outer terminal 312 include substantially the same material (such as solder), the solder paste 340a may be integrally formed with the outer terminal 312. In contrast, when the solder paste 340a includes a material such as gold, copper, aluminum, or other material that is different from a material included in the outer terminal 312, a separate attaching member (not shown) may be formed between the outer terminal 312 and the terminal land 324.

Figure 18:
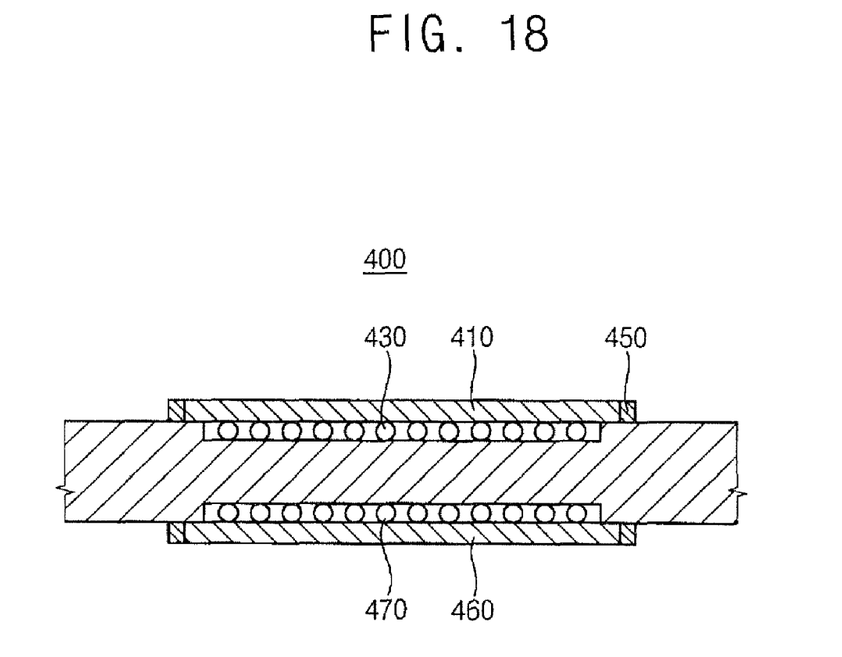
FIG. 18 is a cross-sectional side view illustrating a semiconductor module constructed in accordance with a still further embodiment incorporating principles of the present invention.

FIG. 18 is a cross-sectional side view illustrating a semiconductor module 400 constructed in accordance with a further embodiment incorporating principles of the present invention. Referring to FIG. 18, the semiconductor module 400 of this embodiment preferably includes a PCB 420, a first semiconductor package 410, and a second semiconductor package 460. The PCB 420 has a first face and a second face arranged opposite each other. A first recess 430 is preferably formed in the first face, and a second recess 470 is preferably formed in the second face. The first semiconductor package 410 is received in the first recess 430 and the second semiconductor package 460 is received in the second recess 470.

In this embodiment, the first semiconductor package 410 and the second semiconductor package 460 include elements that are substantially the same as those of the semiconductor package 110 described previously and further description of the first and second semiconductor packages 410, 460 is therefore omitted herein for brevity. In addition, the first and second recesses 430, 470 are substantially the same as the recess 130 described previously and further description with respect to the first and second recesses 430, 470 are therefore also omitted.

According to this embodiment, the semiconductor module 400 includes first and second semiconductor packages 410, 460 mounted on opposite faces of the PCB 420. A method of manufacturing the semiconductor module 400 is substantially the same as the method previously-described with respect to the first embodiment, except that it is applied to both faces of the PCB 420. Any further description of this method is therefore omitted herein for brevity.

According to principles of the present invention, edge portions of the semiconductor package that is received in a recess of the PCB may make contact with the PCB. The PCB may thereby firmly support edge portions of the semiconductor package and prevent damage to those edge portions due to vertical impacts. The supporting member may further firmly support side faces of the semiconductor package that is received in the recess of the PCB to prevent damage to the semiconductor package resulting from horizontal impacts.

Having described various preferred embodiments incorporating principles of the present invention, it should be noted that modifications and variations can be made by persons skilled in the art in light of the above teachings. It should therefore be understood that various changes may be made to the particular embodiments disclosed herein without departing from the scope and the spirit of the invention as outlined by the appended claims.

What is claimed is:

1. A semiconductor module comprising:
    a semiconductor package having an outer terminal;
    a printed circuit board including:
        a substrate body; and
        an insulation layer pattern on the substrate body, wherein the printed circuit board has an upper surface configured to make contact with a lower edge surface of the semiconductor package;
    a recess arranged in the insulation layer pattern and configured to receive the outer terminal including:
        a first opening that exposes the terminal land; and
        a second opening in communication with the first opening, wherein the second opening has a width greater than a width of the first opening and less than a width of the semiconductor package; and
    a terminal land at a bottom face of the recess, wherein the terminal land is electrically connected to the outer terminal.

2. The semiconductor module of claim 1, wherein the first opening has an inner face that makes close contact with the outer terminal.

3. The semiconductor module of claim 1, wherein the insulation layer pattern makes contact with the semiconductor package.

4. The semiconductor module of claim 1, wherein the substrate body and the insulation layer pattern comprise substantially a same material.

5. The semiconductor module of claim 4, wherein the substrate body and the insulation layer pattern comprise a photosensitive resin.

6. The semiconductor module of claim 1, wherein the substrate body and the insulation layer pattern comprise materials different from each other.

7. The semiconductor module of claim 6, wherein the insulation layer pattern comprises a material having an elasticity greater than that of the substrate body.

8. The semiconductor module of claim 7, wherein the insulation layer pattern comprises a rubber, an epoxy-based resin, a polyimide-based resin, or a fluorine-based resin.

9. The semiconductor module of claim 1, wherein the second opening is defined by a spacer.

10. The semiconductor module of claim 9, wherein the first opening has an inner face that makes close contact with the outer terminal.

11. The semiconductor module of claim 9, wherein the spacer makes contact with the semiconductor package.

12. The semiconductor module of claim 1, further comprising a supporting member formed on the printed circuit board to surround side faces of the semiconductor package.

13. The semiconductor module of claim 12, wherein the supporting member makes contact with the side faces of the semiconductor package.

14. The semiconductor module of claim 1, further comprising an attaching member interposed between the outer terminal and the terminal land.

15. The semiconductor module of claim 14, wherein the attaching member comprises a material substantially the same as a material of the outer terminal.

16. The semiconductor module of claim 15, wherein the attaching member and the outer terminal comprise a solder.

17. The semiconductor module of claim 14, wherein the attaching member and the outer terminal comprise materials different from each other.

18. The semiconductor module of claim 17, wherein the attaching member comprises gold, aluminum, or copper, and wherein the outer terminal comprises a solder.

* * * * *